US008009468B2

(12) United States Patent
Andres et al.

(10) Patent No.: US 8,009,468 B2
(45) Date of Patent: Aug. 30, 2011

(54) METHOD FOR FABRICATING AN INTEGRATED CIRCUIT INCLUDING MEMORY ELEMENT WITH SPATIALLY STABLE MATERIAL

(75) Inventors: Dieter Andres, Munich (DE); Thomas Happ, Dresden (DE); Petra Majewski, Munich (DE); Bernhard Ruf, Sauerlach (DE)

(73) Assignee: Qimonda AG, Munich (DE)

( * ) Notice: Subject to any disclaimer, the term of this patent is extended or adjusted under 35 U.S.C. 154(b) by 314 days.

(21) Appl. No.: 12/167,853

(22) Filed: Jul. 3, 2008

(65) Prior Publication Data

US 2009/0052232 A1      Feb. 26, 2009

(51) Int. Cl.
*G11C 11/00* (2006.01)
(52) U.S. Cl. .................. 365/163; 365/148; 365/151
(58) Field of Classification Search .............. 365/148, 365/163, 151, 189.07, 189.09; 257/2, 296, 257/288, 68, 55, 613; 438/694, 102
See application file for complete search history.

(56) References Cited

U.S. PATENT DOCUMENTS

| | | | | |
|---|---|---|---|---|
| 6,806,526 B2 * | 10/2004 | Krieger et al. | ............... | 257/296 |
| 6,869,883 B2 | 3/2005 | Chiang et al. | | |
| 7,196,351 B2 | 3/2007 | Chiang et al. | | |
| 7,286,388 B1 * | 10/2007 | Chen et al. | ............... | 365/151 |
| 2005/0112896 A1 * | 5/2005 | Hamann et al. | ............... | 438/694 |
| 2006/0039192 A1 * | 2/2006 | Ha et al. | ............... | 365/163 |
| 2007/0072125 A1 * | 3/2007 | Sousa et al. | ............... | 430/270.13 |
| 2007/0153571 A1 * | 7/2007 | Elkins | ............... | 365/163 |
| 2008/0042119 A1 * | 2/2008 | Sandoval et al. | ............... | 257/4 |
| 2008/0224120 A1 * | 9/2008 | Czubatyj et al. | ............... | 257/5 |
| 2009/0078924 A1 * | 3/2009 | Liang et al. | ............... | 257/3 |
| 2009/0196094 A1 * | 8/2009 | Breitwisch et al. | ............... | 365/163 |

OTHER PUBLICATIONS

J.H. Oh et al., "Full Integration of Highly Manufacturable 512Mb PRAM based on 90nm Technology", IEEE, 1-4244-0439, Aug. 2006.
Kinan Kim et al., "Reliability Investigations for Manufacturable High Density PRAM", IEEE 05CH37616 43rd Annual International Reliability Physics Symposium, San Jose, 2005, pp. 157-162.
S.J. Ahn et al., "Highly Reliable 50nm Contact Cell Technology for 256Mb PRAM", 2005 Symposium on VLSI Technology Digest of Technical Papers.
Manzur Gill et al., "Ovonic Unified Memory—A High-performance Nonvolatile Memory Technology for Stand Alone Memory and Embedded Applications".
Stefan Lai et al., "OUM—A 180 nm Nonvolatile Memory Cell Element Technology for Stand Alone and Embedded Applications".

* cited by examiner

*Primary Examiner* — Dang T Nguyen
(74) *Attorney, Agent, or Firm* — Edell, Shapiro & Finnan, LLC

(57) ABSTRACT

A method for fabricating an integrated circuit, the method comprises forming a first electrode, depositing resistance changing material over the first electrode, the resistance changing material having an active zone for switching the resistance of the resistance changing material and an inactive zone, and forming a second electrode over the resistance changing material. The chemical composition of the resistance changing material in the active zone differs from the chemical composition of the resistance changing material in the inactive zone.

10 Claims, 12 Drawing Sheets

METHOD FOR FABRICATING AN INTEGRATED CIRCUIT INCLUDING MEMORY ELEMENT WITH SPATIALLY STABLE MATERIAL

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state—"set"—and from the crystalline state to the amorphous state—"reset"—in response to temperature changes. Temperature changes may be applied to the phase change material by heat pulses. The temperature changes of the phase change material may be achieved by driving current through the phase change material itself or by driving current through a resistive heater adjacent the phase change material. With both of these methods, controllable heating of the phase change material causes controllable phase change within the phase change material. Not all of the phase change material is necessarily heated in a phase change operation. Regions or zones without phase change during heating (e.g., while driving current through the phase change material) are called inactive zones. Regions or zones with phase change during heating (e.g., while driving current through the phase change material) are called active zones.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The temperature in the phase change material in each memory cell generally corresponds to the applied level of current and/or voltage to achieve the heating.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

During cycling of the phase change material between amorphous and crystalline states the phase change material may re-distribute and may undergo a compositional degradation in the active zone. Parts of the phase change material's composition may agglomerate or dilute, yielding in different chemical compositions between active and inactive regions of the phase change material. The spatial re-distribution may end in a shift of operation parameters of the memory cell. For future technology nodes, it is desirable to produce phase change memories having stability against spatial material re-distribution and spatial degradation of the phase change material.

SUMMARY

One embodiment provides a method for fabricating an integrated circuit. The method comprises forming a first electrode, depositing resistance changing material over the first electrode, the resistance changing material having an active zone with a switchable resistance and an inactive zone, wherein the chemical composition of the resistance changing material in the active zone differs from the chemical composition of the resistance changing material in the inactive zone, and forming a second electrode over the resistance changing material.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various embodiments described herein may be combined with each other, unless specifically noted otherwise.

Figure 1:
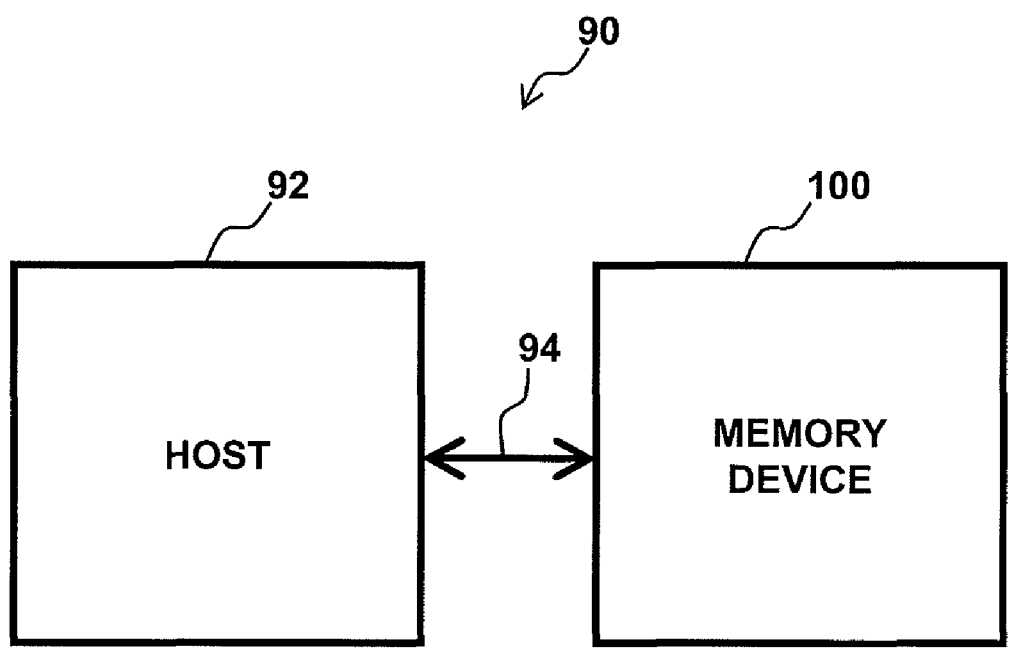
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a microprocessor, computer (e.g., desktop, laptop, handheld), portable electronic device (e.g., cellular phone, personal digital assistant (PDA), MP3 player, video player, digital camera), or any other suitable device that uses memory. Memory device 100 provides memory for host 92. In one embodiment, memory device 100 includes a phase change memory device or other suitable resistive or resistivity changing material memory device.

Figure 2:
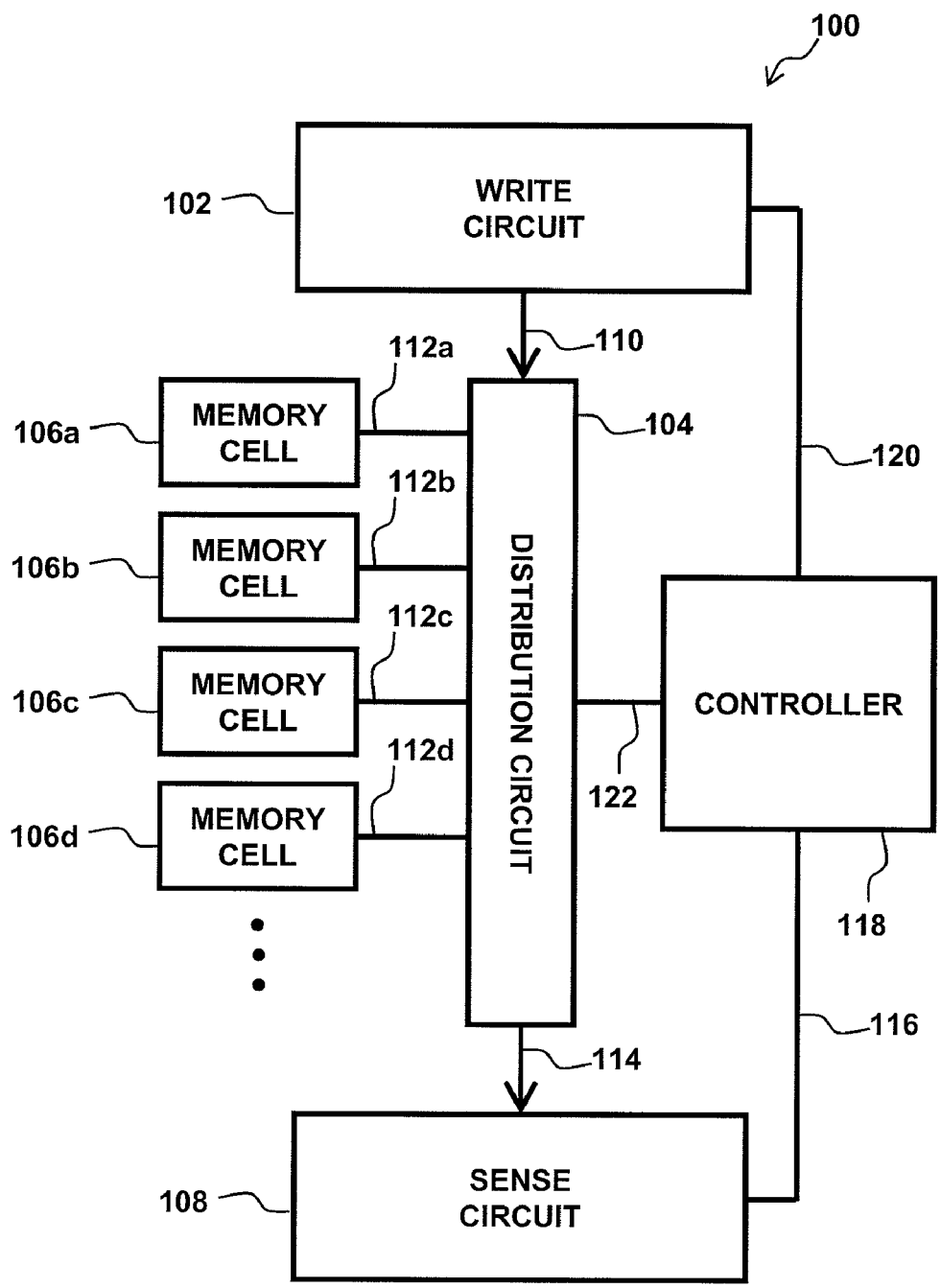
FIG. 2 is a block diagram illustrating one embodiment of a memory device.

FIG. 2 is a block diagram illustrating one embodiment of memory device 100. In one embodiment, memory device 100 is an integrated circuit or part of an integrated circuit. Memory device 100 includes a write circuit 102, a distribution circuit 104, memory cells 106a, 106b, 106c, and 106d, a controller 118, and a sense circuit 108. Each of the memory cells 106a-106d is a phase change memory cell that stores data based on the amorphous and crystalline states of phase change material in the memory cell. Also, each of the memory cells 106a-106d can be programmed into one of two or more states by programming the phase change material to have intermediate resistance values. To program one of the memory cells 106a-106d to an intermediate resistance value, the amount of crystalline material coexisting with amorphous material and hence the cell resistance is controlled using a suitable write strategy.

Each of the memory cells 106a-106d includes phase change material. The phase change material is deposited over a bottom electrode. The phase change material is deposited using chemical vapor deposition (CVD), atomic layer deposition (ALD), physical vapor deposition (PVD), solution based spin-on, or other suitable deposition technique.

As used herein, the term "electrically coupled" is not meant to mean that the elements must be directly coupled together and intervening elements may be provided between the "electrically coupled" elements.

Write circuit 102 is electrically coupled to distribution circuit 104 though signal path 110. Distribution circuit 104 is electrically coupled to each of the memory cells 106a-106d through signal paths 112a-112d. Distribution circuit 104 is electrically coupled to memory cell 106a through signal path 112a. Distribution circuit 104 is electrically coupled to memory cell 106b through signal path 112b. Distribution circuit 104 is electrically coupled to memory cell 106c through signal path 112c. Distribution circuit 104 is electrically coupled to memory cell 106d through signal path 112d. Distribution circuit 104 is electrically coupled to sense circuit 108 through signal path 114. Sense circuit 108 is electrically coupled to controller 118 through signal path 116. Controller 118 is electrically coupled to write circuit 102 through signal path 120 and to distribution circuit 104 through signal path 122.

Each of the memory cells 106a-106d includes a phase change material that may be changed from an amorphous state to a crystalline state or from a crystalline state to an amorphous state under the influence of temperature change. The amount of crystalline phase change material coexisting with amorphous phase change material in one of the memory cells 106a-106d thereby defines two or more states for storing data within memory device 100.

In the amorphous state, a phase change material exhibits significantly higher resistivity than in the crystalline state. Therefore, the two or more states of memory cells 106a-106d differ in their electrical resistivity. In one embodiment, the two or more states include two states and a binary system is used, wherein the two states are assigned bit values of "0" and "1." In another embodiment, the two or more states include three states and a ternary system is used, wherein the three states are assigned bit values of "0", "1", and "2." In another embodiment, the two or more states include four states that are assigned multi-bit values, such as "00", "01", "10", and "11." In other embodiments, the two or more states can be any suitable number of states in the phase change material of a memory cell.

Controller 118 controls the operation of write circuit 102, sense circuit 108, and distribution circuit 104. Controller 118 includes a microprocessor, microcontroller, or other suitable logic circuitry for controlling the operation of write circuit 102, sense circuit 108, and distribution circuit 104. Controller 118 controls write circuit 102 for setting the resistance states of memory cells 106a-106d. Controller 118 controls sense circuit 108 for reading the resistance states of memory cells 106a-106d. Controller 118 controls distribution circuit 104 for selecting memory cells 106a-106d for read or write access. In one embodiment, controller 118 is embedded on the same chip as memory cells 106a-106d. In another embodiment, controller 118 is located on a separate chip from memory cells 106a-106d.

In one embodiment, write circuit 102 provides voltage pulses to distribution circuit 104 through signal path 110, and distribution circuit 104 controllably directs the voltage pulses to memory cells 106a-106d through signal paths 112a-112d. In another embodiment, write circuit 102 provides current pulses to distribution circuit 104 through signal path 110, and distribution circuit 104 controllably directs the current pulses to memory cells 106a-106d through signal paths 112a-112d. In one embodiment, distribution circuit 104 includes a plurality of transistors that controllably direct the voltage pulses or the current pulses to each of the memory cells 106a-106d. In another embodiment, distribution circuit 104 includes a plurality of diodes that controllably direct the voltage pulses or the current pulses to each of the memory cells 106a-106d.

Sense circuit 108 reads each of the two or more states of memory cells 106a-106d through signal path 114. Distribution circuit 104 controllably directs read signals between sense circuit 108 and memory cells 106a-106d through signal paths 112a-112d. In one embodiment, distribution circuit 104 includes a plurality of transistors that controllably direct read signals between sense circuit 108 and memory cells 106a-106d. In one embodiment, to read the resistance of one of the memory cells 106a-106d, sense circuit 108 provides current that flows through one of the memory cells 106a-106d and sense circuit 108 reads the voltage across that one of the memory cells 106a-106d. In another embodiment, sense circuit 108 provides voltage across one of the memory cells 106a-106d and reads the current that flows through that one of the memory cells 106a-106d. In another embodiment, write circuit 102 provides voltage across one of the memory cells 106a-106d and sense circuit 108 reads the current that flows through that one of the memory cells 106a-106d. In another embodiment, write circuit 102 provides current through one of the memory cells 106a-106d and sense circuit 108 reads the voltage across that one of the memory cells 106a-106d.

To program a memory cell 106a-106d within memory device 100, write circuit 102 generates one or more current or voltage pulses for heating the phase change material in the target memory cell. In one embodiment, write circuit 102 generates appropriate current or voltage pulses, which are fed into distribution circuit 104 and distributed to the appropriate target memory cell 106a-106d. The amplitude and duration of the current or voltage pulses are controlled depending on whether the memory cell is being set or reset.

Generally, a "set" operation of a memory cell is heating the phase change material of the target memory cell above its crystallization temperature (but usually below its melting temperature) long enough to achieve the crystalline state or a partially crystalline and partially amorphous state. Generally, a "reset" operation of a memory cell is heating the phase change material of the target memory cell above its melting temperature, and then quickly quench cooling the material, thereby achieving the amorphous state or a partially amorphous and partially crystalline state.

During "set" operation or "reset" operation the phase change material is partially heated. That portion of the phase change material which is effectively heated and which changes from crystalline to amorphous state or vice versa is called the active portion of the phase change material or the active zone. That portion of the phase change material which is not sufficiently heated for phase transition (which is not changing from crystalline to amorphous state or vice versa) is called the inactive portion of the phase change material or the inactive zone.

Figure 3A:
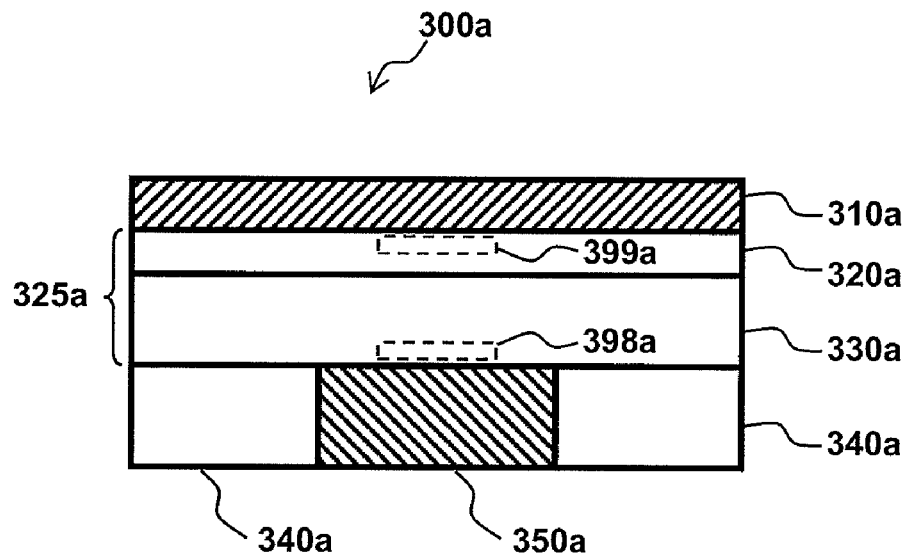
FIG. 3a illustrates a cross-sectional view of one embodiment of a phase change memory cell.

FIG. 3a illustrates a cross-sectional view of one embodiment of a phase change memory cell 300a. In one embodiment, each of the phase change memory cells 106a-106d previously described and illustrated with reference to FIG. 2 is similar to phase change memory cell 300a. Phase change memory cell 300a includes a first electrode 350a, a phase change element 325a, a second electrode 310a, and dielectric material 340a. Phase change element 325a comprises two phase change materials 320a and 330a.

First electrode 350a can comprise one or more of: TiN, TaN, W, Al, Ti, Ta, TiSiN, TaSiN, TiAlN, TaAlN, WN, C, CN, TaCN, or other suitable electrode material. In one embodiment, phase change element 325a has a greater cross-sectional width than first electrode 350a, such that first electrode 350a provides a heater electrode. The top of first electrode 350a contacts the bottom of phase change element 325a.

In one embodiment, phase change materials 320a and 330a comprise a phase change material that may be made up of a variety of materials. Generally, chalcogenide alloys that contain one or more elements from Group VI of the periodic table are useful as such materials. In one embodiment, the phase change material is made up of a chalcogenide compound material, such as GeSbTe (GST), SbTe, GeTe, AgInSbTe, $Ge_2Sb_2Te_5$, InSbTe, (GeSn)SbTe, GaSeTe, GeSb(SeTe), $SnSb_2Te_4$, $Te_{81}Ge_{15}Sb_2S_2$, or $Sb_2Te_3$. In another embodiment, the phase change material is chalcogen free, such as GeSb, GaSb, InSb, or GeGaInSb, InSe, or InSbGe. In further embodiments, Bi replaces Sb in the aforementioned materials. In other embodiments, the phase change material is made up of any suitable material including one or more of the elements Ge, Sb, Te, Ga, As, In, Ge, Se, Ag, Bi, and S.

Generally, the resistance changing materials 320a and 330a are selected to stabilize the memory element 325a against spatial material re-distribution and spatial degradation of the resistance changing material during operation. For example, for GST material, Sb may agglomerate in the active zone of the phase change material. By selecting the phase change material in the inactive zone with less Sb, a diffusion of Sb towards the active zone is inhibited.

In one embodiment, phase change material 320a is free of Antimony (Sb). In another embodiment, phase change element 320a comprises at least one of Germanium (Ge) or Tellurium (Te). A part of the active zone 398a in phase change element 325a is at or close to the interface area between first electrode 350a and phase change element 325a within phase change material 330a. Resistance changing material 330a includes "standard" resistance changing material for storing data in memory cell 300a. A part of the inactive zone 399a in phase change element 325a is at or close to the interface area between second electrode 310a and phase change element 325a within phase change material 320a. Phase change element 325a has a greater cross-sectional width than first electrode 350a (so called "mushroom" concept).

The top of phase change element 325a contacts the bottom of second electrode 310a. In one embodiment, second electrode 310a has the same or a greater cross-sectional width than phase change element 325a. Second electrode 310a can includes one of more of: TiN, TaN, W, Al, Ti, Ta, TiSiN, TaSiN, TiAlN, TaAlN, WN, C, CN, TaCN, or other suitable electrode material. Dielectric material 340a laterally surrounds first electrode 350a. Dielectric material 340a includes $SiO_2$, $SiO_x$, SiN, SiON, $AlO_x$, fluorinated silica glass (FSG), boro-phosphorus silicate glass (BPSG), boro-silicate glass (BSG), or other suitable dielectric material.

Phase change element 325a provides a storage location for storing one or more bits of data. During operation of memory cell 300a, current or voltage pulses are applied between first electrode 350a and second electrode 310a to program the memory cell. The active zone 398a in phase change element 325a is at or close to the interface area between first electrode 350a and phase change element 325a.

During a "set" operation of memory cell 300a, one or more set current or voltage pulses are selectively enabled by write circuit 102 and sent to first electrode 350a or second electrode 310a. From first electrode 350a or second electrode 310a, the set current or voltage pulses pass through phase change element 325a thereby heating the phase change material above its crystallization temperature (but usually below its melting temperature). In this way, the phase change material reaches a crystalline state or a partially crystalline and partially amorphous state during the "set" operation.

During a "reset" operation of memory cell 300a, a reset current or voltage pulse is selectively enabled by write circuit 102 and sent to first electrode 350a or second electrode 310a. From first electrode 350a or second electrode 310a, the reset current or voltage pulse passes through phase change element 325a. The reset current or voltage quickly heats the phase change material above its melting temperature. After the current or voltage pulse is turned off, the phase change material quickly quench cools into an amorphous state or a partially amorphous and partially crystalline state.

Figure 3B:
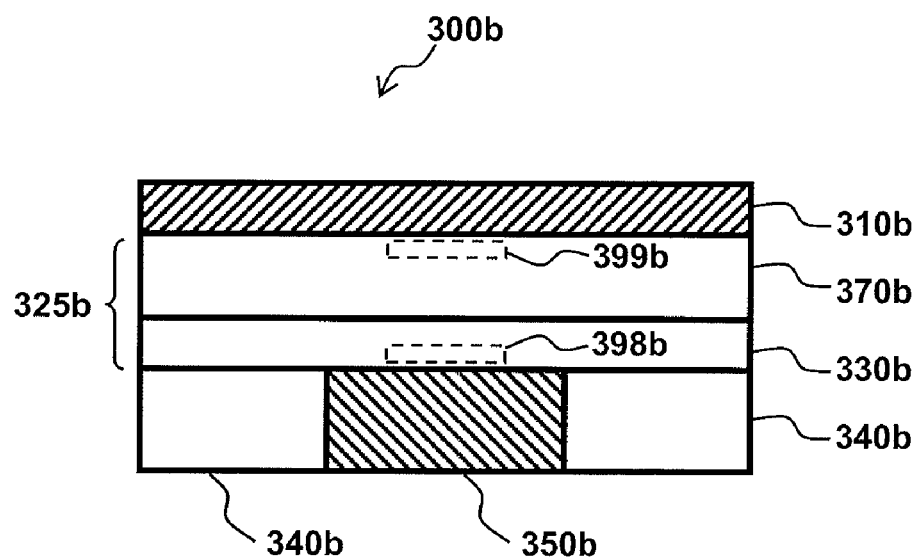
FIG. 3b illustrates a cross-sectional view of another embodiment of a phase change memory cell.

FIG. 3b illustrates a cross-sectional view of another embodiment of a phase change memory cell 300b. Memory cell 300b includes first electrode 350b, memory element 325b, and second electrode 310b. Dielectric material 340b laterally surrounds first electrode 350b. Memory element 325b includes resistance changing materials 370b and 330b. Resistance changing material 330b includes "standard" resistance changing material for storing data in memory cell 300b. In contrast to FIG. 3a, resistance changing material 370b contains at least some Antimony (Sb), but less Sb than resistance changing material 330b.

A part of the active zone 398b in phase change element 325b is at or close to the interface area between first electrode 350b and phase change element 325b within phase change material 330b. A part of the inactive zone 399b in phase change element 325b is at or close to the interface area between second electrode 310b and phase change element 325b within phase change material 370b. Phase change element 325b has a greater cross-sectional width than first electrode 350b (so called "mushroom" concept).

Figure 3C:
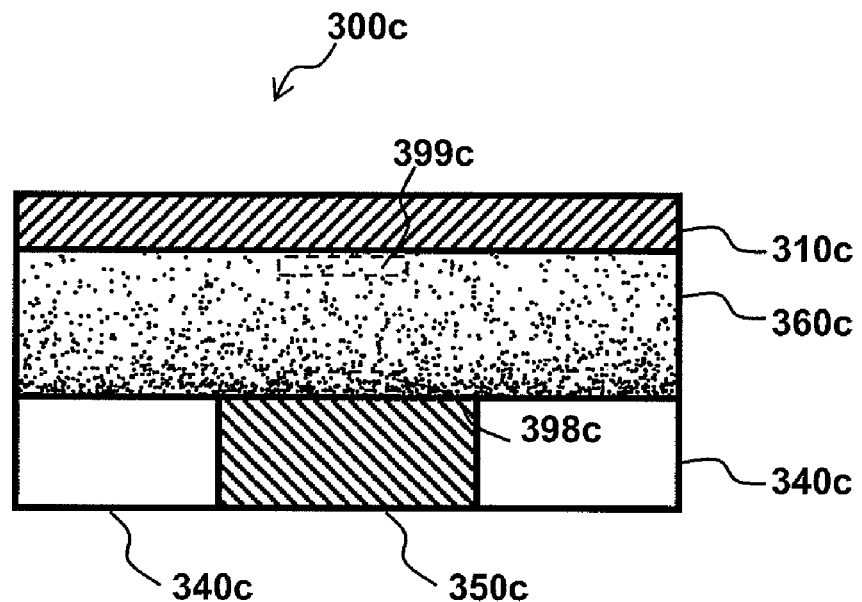
FIG. 3c illustrates a cross-sectional view of another embodiment of a phase change memory cell.

FIG. 3c illustrates a cross-sectional view of another embodiment of a phase change memory cell 300c. Memory cell 300c includes first electrode 350c, memory element 360c, and second electrode 310c. Dielectric material 340c laterally surrounds first electrode 350c. Resistance changing material 360c has a gradual change in chemical composition from the active zone towards the inactive zone.

A part of the active zone 398c in phase change element 360c is at or close to the interface area between first electrode 350c and phase change element 360c within phase change material 360c. The chemical composition of phase change element 360c in the active zone 398c is that of "standard" resistance changing material for storing data in memory cell 300c. A part of the inactive zone 399c in phase change element 360c is at or close to the interface area between second electrode 310c and phase change element 360c within phase change material 360c. The chemical composition of phase change element 360c in the inactive zone 399c has less or no Antimony (Sb) content compared to the resistance changing material in the active zone. Phase change element 360c has a greater cross-sectional width than first electrode 350c (so called "mushroom" concept).

Figure 4A:
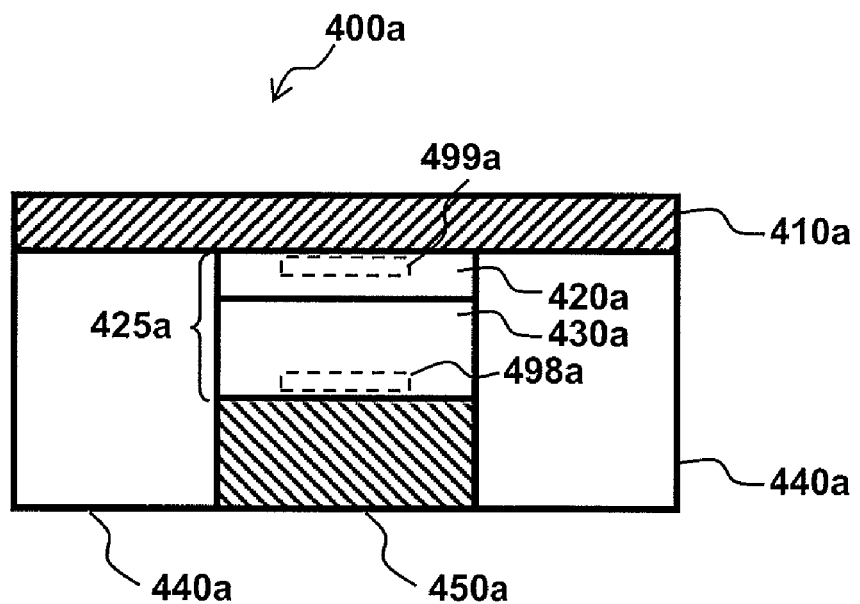
FIG. 4a illustrates a cross-sectional view of another embodiment of a phase change memory cell.

FIG. 4a illustrates a cross-sectional view of another embodiment of a phase change memory cell 400a. Memory cell 400a includes first electrode 450a, memory element 425a, and second electrode 410a. Dielectric material 440a laterally surrounds first electrode 450a. Memory element 425a includes resistance changing materials 420a and 430a. Resistance changing material 430a includes "standard" resistance changing material for storing data in memory cell 400a. Resistance changing material 420a contains no Antimony (Sb).

A part of the active zone 498a in phase change element 425a is at or close to the interface area between first electrode 450a and phase change element 425a within phase change material 430a. A part of the inactive zone 499a in phase change element 425a are at or close to the interface area between second electrode 410a and phase change element 425a within phase change material 420a. In contrast to FIGS. 3a-3c, phase change element 425a has nearly the same cross-sectional width as first electrode 450a (so called "pillar" or "pore" concept).

Figure 4B:
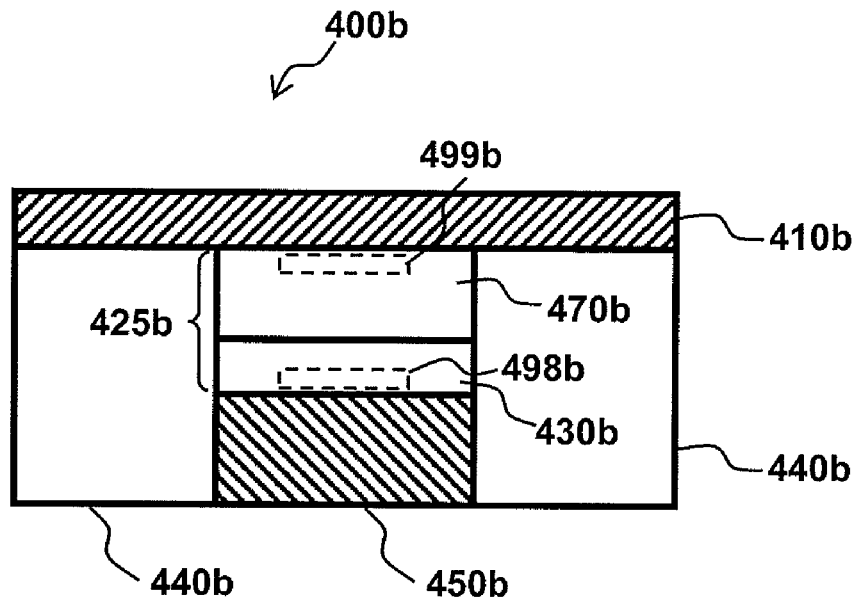
FIG. 4b illustrates a cross-sectional view of another embodiment of a phase change memory cell.

FIG. 4b illustrates a cross-sectional view of another embodiment of a phase change memory cell 400b. Memory cell 400b includes first electrode 450b, memory element 425b, and second electrode 410b. Dielectric material 440b laterally surrounds first electrode 450b. Memory element 425b includes resistance changing materials 470b and 430b. Resistance changing material 430b includes "standard" resistance changing material for storing data in memory cell 400b. Resistance changing material 470b contains less Antimony (Sb) than resistance changing material 430b.

A part of the active zone 498b in phase change element 425b is at or close to the interface area between first electrode 450b and phase change element 425b within phase change material 430b. A part of the inactive zone 499b in phase change element 425b is at or close to the interface area between second electrode 410b and phase change element 425b within phase change material 470b. In contrast to FIGS. 3a-3c, phase change element 425b has nearly the same cross-sectional width as first electrode 450b (so called "pillar" or "pore" concept).

Figure 4C:
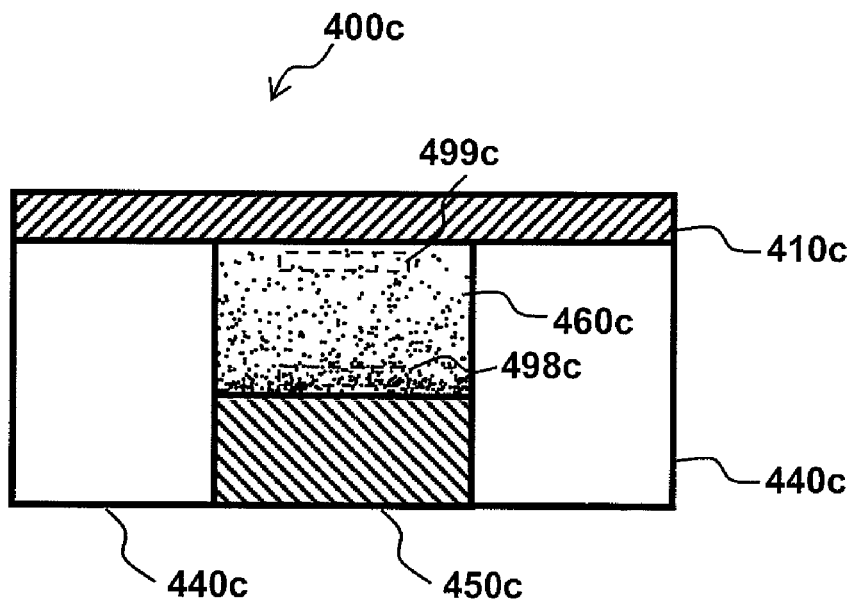
FIG. 4c illustrates a cross-sectional view of another embodiment of a phase change memory cell.

FIG. 4c illustrates a cross-sectional view of another embodiment of a phase change memory cell 400c. Memory cell 400c includes first electrode 450c, memory element 460c, and second electrode 410c. Dielectric material 440c laterally surrounds first electrode 450c. Resistance changing material 460c has a gradual change in chemical composition from the active zone towards the inactive zone. That is, rather than having two distinct resistance changing material layers where the chemical composition changes abruptly at the interface, the composition changes over a continuum from one electrode to the other (the profile of the composition between the two electrode is a continuous function with so significant step functions or discontinuities).

A part of the active zone 498c in phase change element 460c is at or close to the interface area between first electrode 450c and phase change element 460c within phase change material 460c. The chemical composition of phase change element 460c in the active zone 498c is that of "standard" resistance changing material for storing data in memory cell 400c. A part of the inactive zone 499c in phase change element 460c is at or close to the interface area between second electrode 410c and phase change element 460c within phase change material 460c. The chemical composition of phase change element 460c in the inactive zone 499c has less or no Antimony (Sb) content compared to the resistance changing material in the active zone. In contrast to FIGS. 3a-3c, phase change element 460c has nearly the same cross-sectional width as first electrode 450c (so called "pillar" or "pore" concept).

Figure 4D:
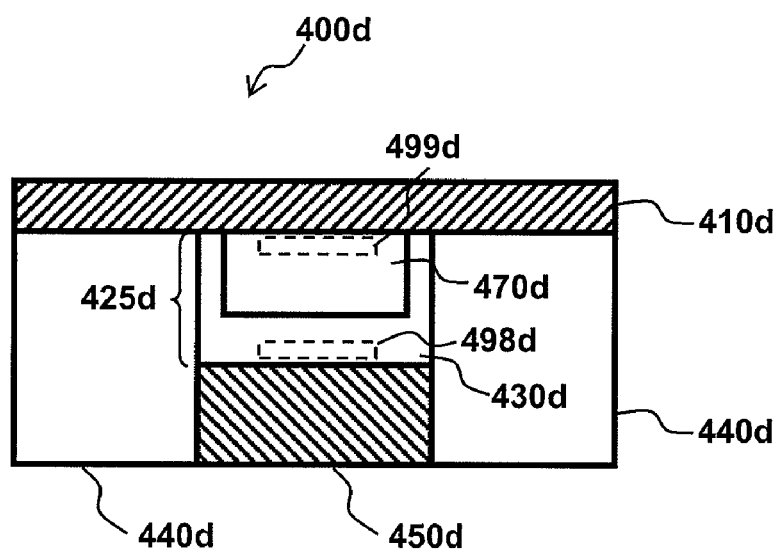
FIG. 4d illustrates a cross-sectional view of another embodiment of a phase change memory cell.

FIG. 4d illustrates a cross-sectional view of another embodiment of a phase change memory cell 400d. Memory cell 400d includes first electrode 450d, memory element 425d, and second electrode 410d. Dielectric material 440d laterally surrounds first electrode 450d. Memory element 425d includes resistance changing materials 470d and 430d. Resistance changing material 430d includes "standard" resistance changing material for storing data in memory cell 400d. Resistance changing material 470d contains less Antimony (Sb) than resistance changing material 430d. Resistance changing material 470d is embedded into resistance changing material 430d, whereby resistance changing material 430d has contact to resistance changing material 470d laterally and horizontally (surrounding resistance changing material 470d on all sides except the upper side that has an interface with second electrode 410d).

A part of the active zone 498d in phase change element 425d is at or close to the interface area between first electrode 450d and phase change element 425d within phase change material 430d. A part of the inactive zone 499d in phase change element 425d is at or close to the interface area between second electrode 410d and phase change element 425d within phase change material 470d. In contrast to FIGS. 3a-3c, phase change element 425d has nearly the same cross-sectional width as first electrode 450d (so called "pillar" or "pore" concept).

Figure 5A:
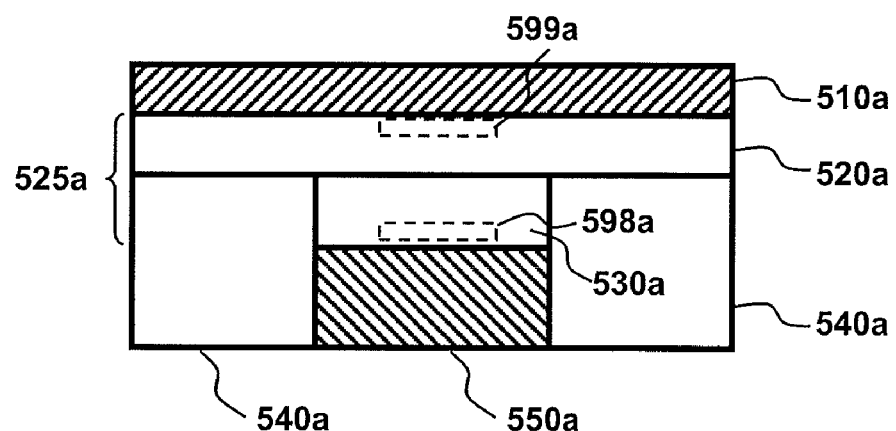
FIG. 5a illustrates a cross-sectional view of another embodiment of a phase change memory cell.

FIG. 5a illustrates a cross-sectional view of another embodiment of a phase change memory cell 500a. Memory cell 500a includes first electrode 550a, memory element 525a, and second electrode 510a. Dielectric material 540a laterally surrounds first electrode 550a. Memory element 525a includes resistance changing materials 520a and 530a. Resistance changing material 530a includes "standard" resistance changing material for storing data in memory cell 500a. Resistance changing material 520a contains no Antimony (Sb).

A part of the active zone 598a in phase change element 525a is at or close to the interface area between first electrode 550a and phase change element 525a within phase change material 530a. A part of the inactive zone 599a in phase change element 525a is at or close to the interface area between second electrode 510a and phase change element 525a within phase change material 520a. In contrast to FIGS. 3a-3c, resistance changing material 530a has nearly the same cross-sectional width as first electrode 550a and resistance changing material 520a extends laterally over first electrode 550a (so called "recessed heater" concept).

Figure 5B:
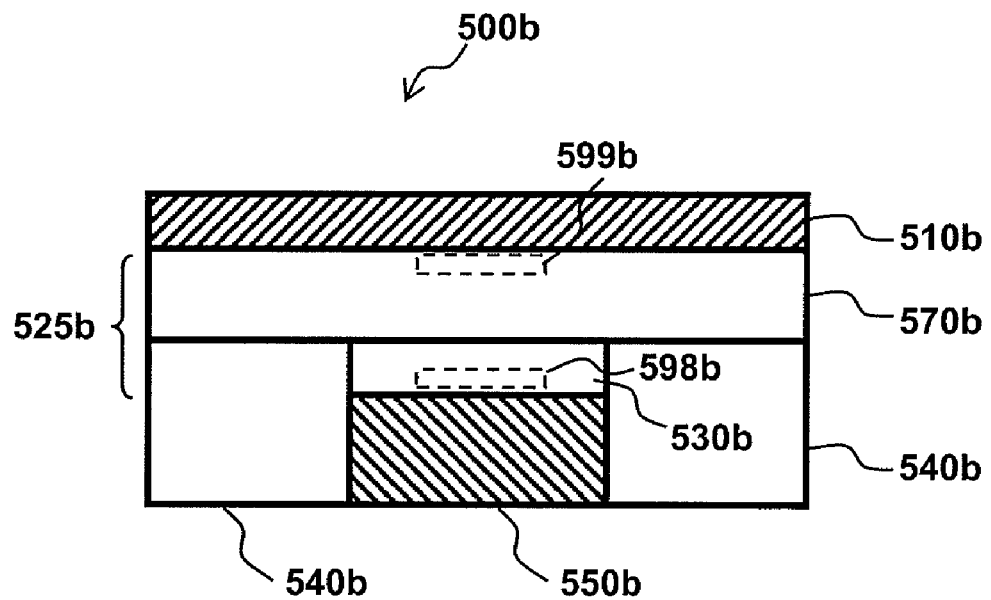
FIG. 5b illustrates a cross-sectional view of another embodiment of a phase change memory cell.

FIG. 5b illustrates a cross-sectional view of another embodiment of a phase change memory cell 500b. Memory cell 500b includes first electrode 550b, memory element 525b, and second electrode 510b. Dielectric material 540b laterally surrounds first electrode 550b. Memory element 525b includes resistance changing materials 570b and 530b. Resistance changing material 530b includes "standard" resistance changing material for storing data in memory cell 500b. Resistance changing material 570b contains less Antimony (Sb) than resistance changing material 530b.

A part of the active zone 598b in phase change element 525b is at or close to the interface area between first electrode 550b and phase change element 525b within phase change material 530b. A part of the inactive zone 599b in phase change element 525b is at or close to the interface area between second electrode 510b and phase change element 525b within phase change material 570b. In contrast to FIGS. 3a-3c, resistance changing material 530b has nearly the same cross-sectional width as first electrode 550b and resistance changing material 570b extends laterally over first electrode 550b (so called "recessed heater" concept).

Figure 5C:
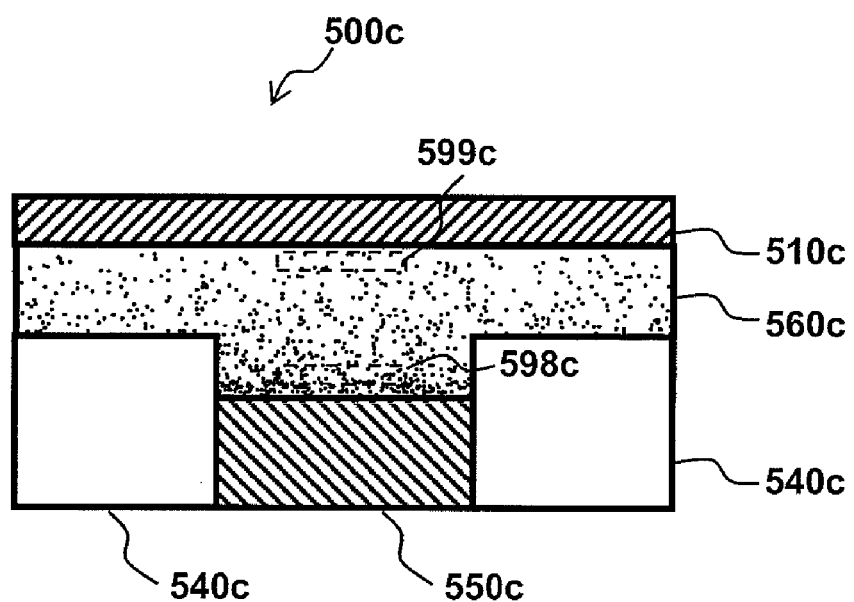
FIG. 5c illustrates a cross-sectional view of another embodiment of a phase change memory cell.

FIG. 5c illustrates a cross-sectional view of another embodiment of a phase change memory cell 500c. Memory cell 500c includes first electrode 550c, memory element 560c, and second electrode 510c. Dielectric material 540c laterally surrounds first electrode 550c. Resistance changing material 560c has a gradual change in chemical composition from the active zone towards the inactive zone.

A part of the active zone 598c in phase change element 560c is at or close to the interface area between first electrode 550c and phase change element 560c within phase change material 560c. The chemical composition of phase change element 560c in the active zone 598c is that of "standard" resistance changing material for storing data in memory cell 500c. A part of the inactive zone 599c in phase change element 560c is at or close to the interface area between second electrode 510c and phase change element 560c within phase change material 560c. The chemical composition of phase change element 560c in the inactive zone 599c has less or no Antimony (Sb) content compared to the resistance changing material in the active zone. In contrast to FIGS. 3a-3c, phase change element 560c has nearly the same cross-sectional width as first electrode 550c at first electrode 550c and extends laterally over first electrode 550c at second electrode 510c (so called "recessed heater" concept).

Figure 6A:
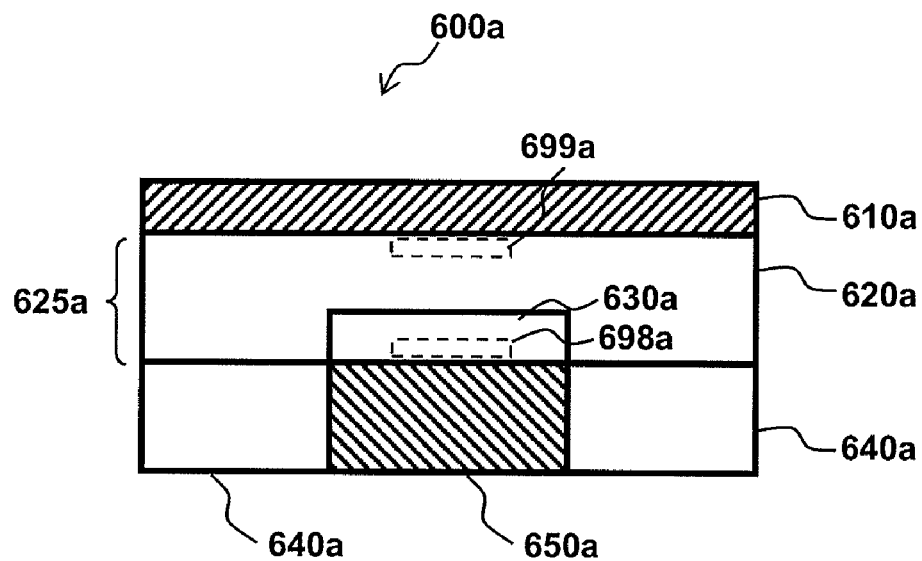
FIG. 6a illustrates a cross-sectional view of another embodiment of a phase change memory cell.

FIG. 6a illustrates a cross-sectional view of another embodiment of a phase change memory cell 600a. Memory cell 600a includes first electrode 650a, memory element 625a, and second electrode 610a. Dielectric material 640a laterally surrounds first electrode 650a. Memory element 625a includes resistance changing materials 620a and 630a. Resistance changing material 630a is embedded into resistance changing material 620a, whereby resistance changing material 620a has contact to resistance changing material 630a laterally and horizontally. Resistance changing material 630a includes "standard" resistance changing material for storing data in memory cell 600a. Resistance changing material 620a contains no Antimony (Sb).

A part of the active zone 698a in phase change element 625a is at or close to the interface area between first electrode 650a and phase change element 625a within phase change material 630a. A part of the inactive zone 699a in phase change element 625a is at or close to the interface area between second electrode 610a and phase change element 625a within phase change material 620a. In contrast to FIGS. 3a-3c, resistance changing material 630a has nearly the same cross-sectional width as first electrode 650a and resistance changing material 620a extends over first electrode 650a (so called "pore in mushroom" concept).

Figure 6B:
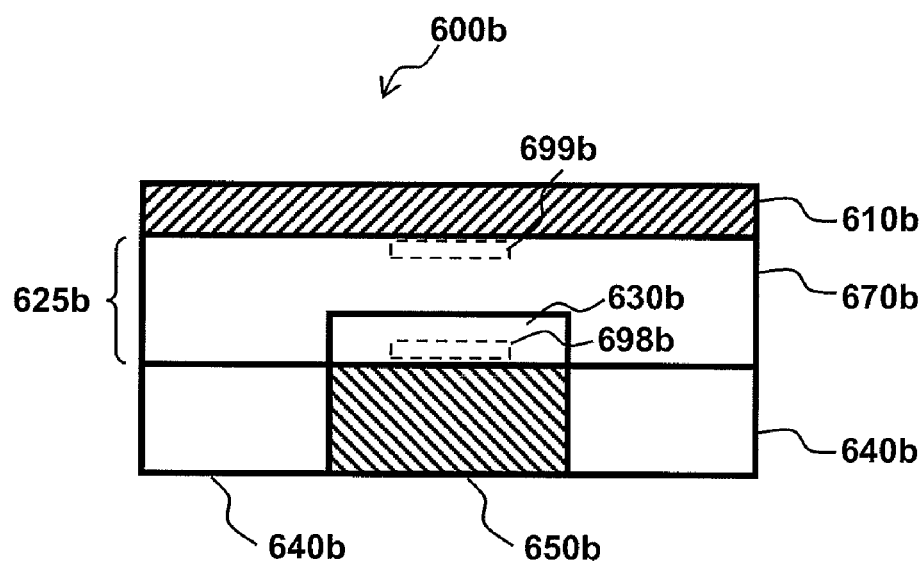
FIG. 6b illustrates a cross-sectional view of another embodiment of a phase change memory cell.

FIG. 6b illustrates a cross-sectional view of another embodiment of a phase change memory cell 600b. Memory cell 600b includes first electrode 650b, memory element 625b, and second electrode 610b. Dielectric material 640b laterally surrounds first electrode 650b. Memory element 625b includes resistance changing materials 670b and 630b. Resistance changing material 630b is embedded into resistance changing material 670b, whereby resistance changing material 670b has contact to resistance changing material 630b laterally and horizontally. Resistance changing material 630b includes "standard" resistance changing material for storing data in memory cell 600b. Resistance changing material 670b contains less Antimony (Sb) than resistance changing material 630b.

A part of the active zone 698b in phase change element 625b is at or close to the interface area between first electrode 650b and phase change element 625b within phase change material 630b. A part of the inactive zone 699b in phase change element 625b is at or close to the interface area between second electrode 610b and phase change element 625b within phase change material 670b. In contrast to FIGS. 3a-3c, resistance changing material 630b has nearly the same cross-sectional width as first electrode 650b and resistance changing material 670b extends over first electrode 650b (so called "pore in mushroom" concept).

Figure 7A:
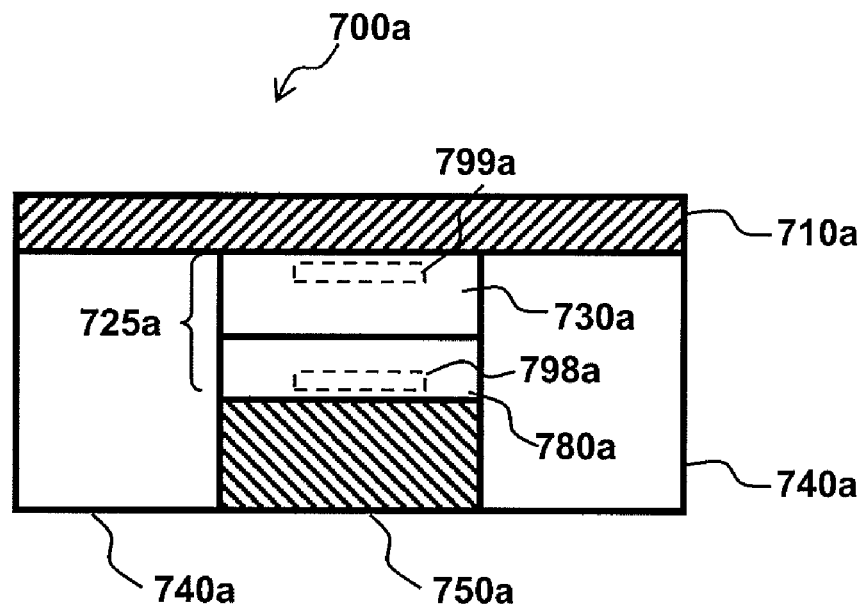
FIG. 7a illustrates a cross-sectional view of another embodiment of a phase change memory cell.

FIG. 7a illustrates a cross-sectional view of another embodiment of a phase change memory cell 700a. Memory cell 700a includes first electrode 750a, memory element 725a, and second electrode 710a. Dielectric material 740a laterally surrounds first electrode 750a. Memory element 725a includes resistance changing materials 780a and 730a. Resistance changing material 730a includes "standard" resistance changing material for storing data in memory cell 700a. Resistance changing material 780a contains Antimony (Sb).

A part of the active zone 798a in phase change element 725a is at or close to the interface area between first electrode 750a and phase change element 725a within phase change material 780a. A part of the inactive zone 799a in phase change element 725a is at or close to the interface area between second electrode 710a and phase change element 725a within phase change material 730a. In contrast to FIGS. 3a-3c, phase change element 725a has nearly the same cross-sectional width as first electrode 750a (so called "pillar" or "pore" concept).

Figure 7B:
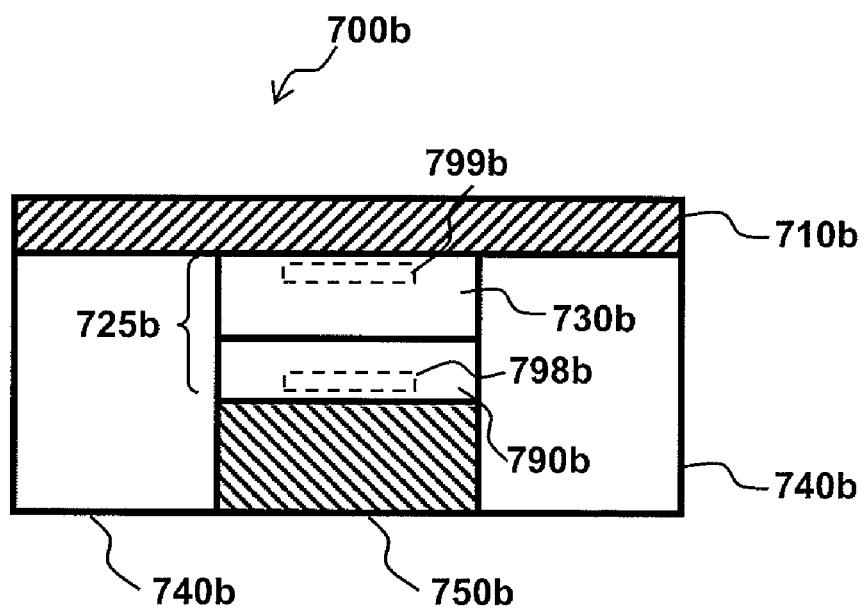
FIG. 7b illustrates a cross-sectional view of another embodiment of a phase change memory cell.

FIG. 7b illustrates a cross-sectional view of another embodiment of a phase change memory cell 700b. Memory cell 700b includes first electrode 750b, memory element 725b, and second electrode 710b. Dielectric material 740b laterally surrounds first electrode 750b. Memory element 725b includes resistance changing materials 790b and 730b. Resistance changing material 730b includes "standard" resistance changing material for storing data in memory cell 700b. Resistance changing material 790b contains more Antimony (Sb) than resistance changing material 730b.

A part of the active zone 798b in phase change element 725b is at or close to the interface area between first electrode 750b and phase change element 725b within phase change material 790b. A part of the inactive zone 799b in phase change element 725b is at or close to the interface area between second electrode 710b and phase change element 725b within phase change material 730b. In contrast to FIGS. 3a-3c, phase change element 725b has nearly the same cross-sectional width as first electrode 750b (so called "pillar" or "pore" concept).

Figure 7C:
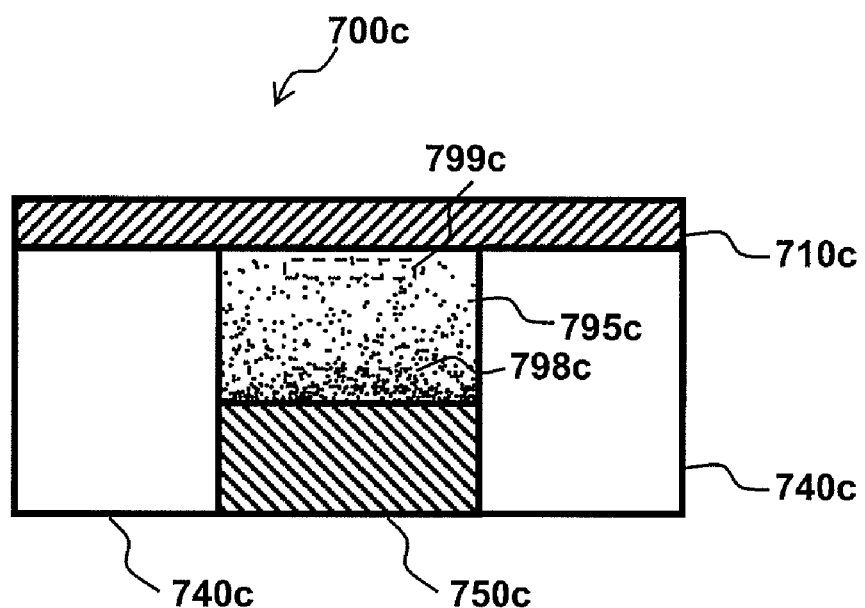
FIG. 7c illustrates a cross-sectional view of another embodiment of a phase change memory cell.

FIG. 7c illustrates a cross-sectional view of another embodiment of a phase change memory cell 700c. Memory cell 700c includes first electrode 750c, memory element 795c, and second electrode 710c. Dielectric material 740c laterally surrounds first electrode 750c. Resistance changing material 795c has a gradual change in chemical composition from the active zone towards the inactive zone.

A part of the active zone 798c in phase change element 795c is at or close to the interface area between first electrode 750c and phase change element 795c within phase change material 795c. The chemical composition of phase change element 795c in the active zone 798c has more Antimony (Sb) content compared to the resistance changing material in the inactive zone 799c. A part of the inactive zone 799c in phase change element 795c is at or close to the interface area between second electrode 710c and phase change element 795c within phase change material 795c. The chemical composition of phase change element 795c in the inactive zone 799c is that of "standard" resistance changing material for storing data in memory cell 700c. In contrast to FIGS. 3a-3c, phase change element 795c has nearly the same cross-sectional width as first electrode 750c (so called "pillar" or "pore" concept).

Figure 8A:
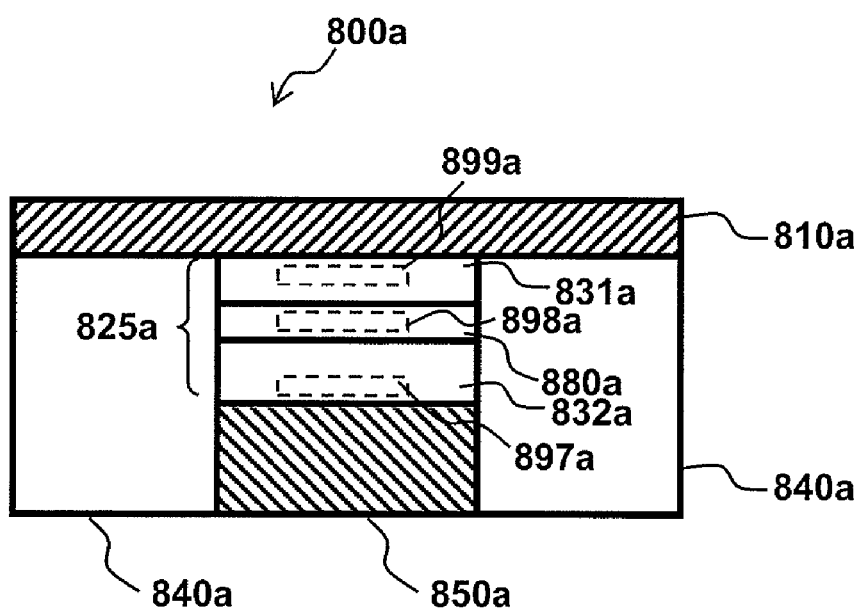
FIG. 8a illustrates a cross-sectional view of another embodiment of a phase change memory cell.
Figure 8B:
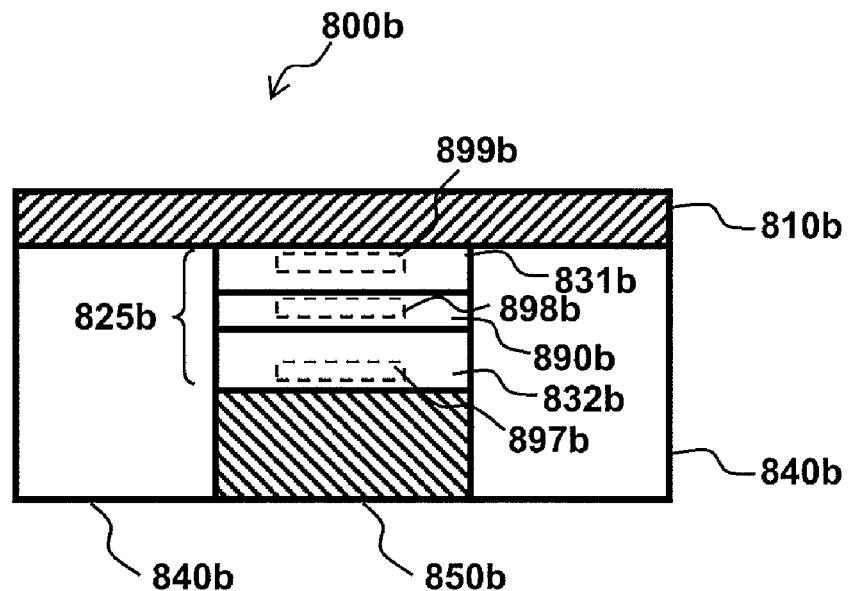
FIG. 8b illustrates a cross-sectional view of another embodiment of a phase change memory cell.
Figure 8C:
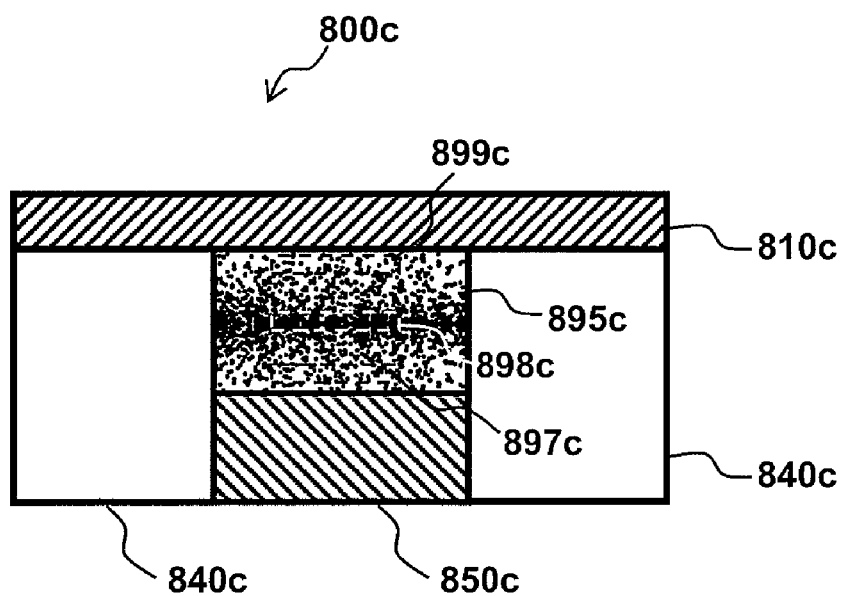
FIG. 8c illustrates a cross-sectional view of another embodiment of a phase change memory cell.

In the embodiments illustrated so far, the first electrode was forming a so called "heater" structure, heating the phase change element in the active zone next to the interface between phase change element and heater. In contrast to these embodiments, FIGS. 8a-8c illustrate embodiments without a heater electrode. For these embodiments a driving current itself heats the phase change material.

FIG. 8a illustrates a cross-sectional view of another embodiment of a phase change memory cell 800a. Memory cell 800a includes first electrode 850a, memory element 825a, and second electrode 810a. Dielectric material 840a laterally surrounds first electrode 850a. Memory element 825a includes a stack of resistance changing materials 831a, 880a, and 832a. Resistance changing materials 831a and 832a include "standard" resistance changing material for storing data in memory cell 800a. Resistance changing material 880a contains Antimony (Sb) and is sandwiched by resistance changing materials 831a and 832a. In one embodiment, changing material 831a and changing material 832a differ. In another embodiment, changing material 831a and changing material 832a comprise the same material.

A part of the active zone 898a in phase change element 825a is within the resistance changing material 880a. Parts of the inactive zones 897a/899a in phase change element 825a are at or close to the interface area between first electrode 850a or second electrode 810a and phase change element 825a. In contrast to FIGS. 3a-3c, phase change element 825a has nearly the same cross-sectional width as first electrode 850a (so called "pillar" or "pore" concept).

FIG. 8b illustrates a cross-sectional view of another embodiment of a phase change memory cell 800b. Memory cell 800b includes first electrode 850b, memory element 825b, and second electrode 810b. Dielectric material 840b laterally surrounds first electrode 850b. Memory element 825b includes a stack of resistance changing materials 831b, 890b, and 832b. Resistance changing materials 831b and 832b include "standard" resistance changing material for storing data in memory cell 800b. Resistance changing material 890b contains more Antimony (Sb) than resistance changing materials 831b and 832b. In one embodiment, changing material 831b and changing material 832b differ. In another embodiment, changing material 831b and changing material 832b comprise the same material.

A part of the active zone 898b in phase change element 825b is within the resistance changing material 890b. Parts of the inactive zones 897b/899b in phase change element 825b are at or close to the interface area between first electrode 850b or second electrode 810b and phase change element 825b. In contrast to FIGS. 3a-3c, phase change element 825b has nearly the same cross-sectional width as first electrode 850b (so called "pillar" or "pore" concept).

FIG. 8c illustrates a cross-sectional view of another embodiment of a phase change memory cell 800c. Memory cell 800c includes first electrode 850c, memory element 895c, and second electrode 810c. Dielectric material 840c laterally surrounds first electrode 850c. Resistance changing material 895c has a gradual change in chemical composition from the active zone towards the inactive zones.

Parts of the inactive zone 897c/899c in phase change element 895c are at or close to the interface area between first electrode 850c or second electrode 810c and phase change element 895c within phase change material 895c. The chemical composition of phase change element 895c in the inactive zones 897c/899c includes "standard" resistance changing material for storing data in memory cell 800c. A part of the active zone 898c in phase change element 895c is at or close to the vertical center of phase change element 895c within phase change material 895c. The chemical composition of phase change element 895c in the active zone 898c has more Antimony (Sb) content compared to the resistance changing material in the inactive zones 897c/899c. In contrast to FIGS. 3a-3c, phase change element 895c has nearly the same cross-sectional width as first electrode 750c (so called "pillar" or "pore" concept).

Figure 9:
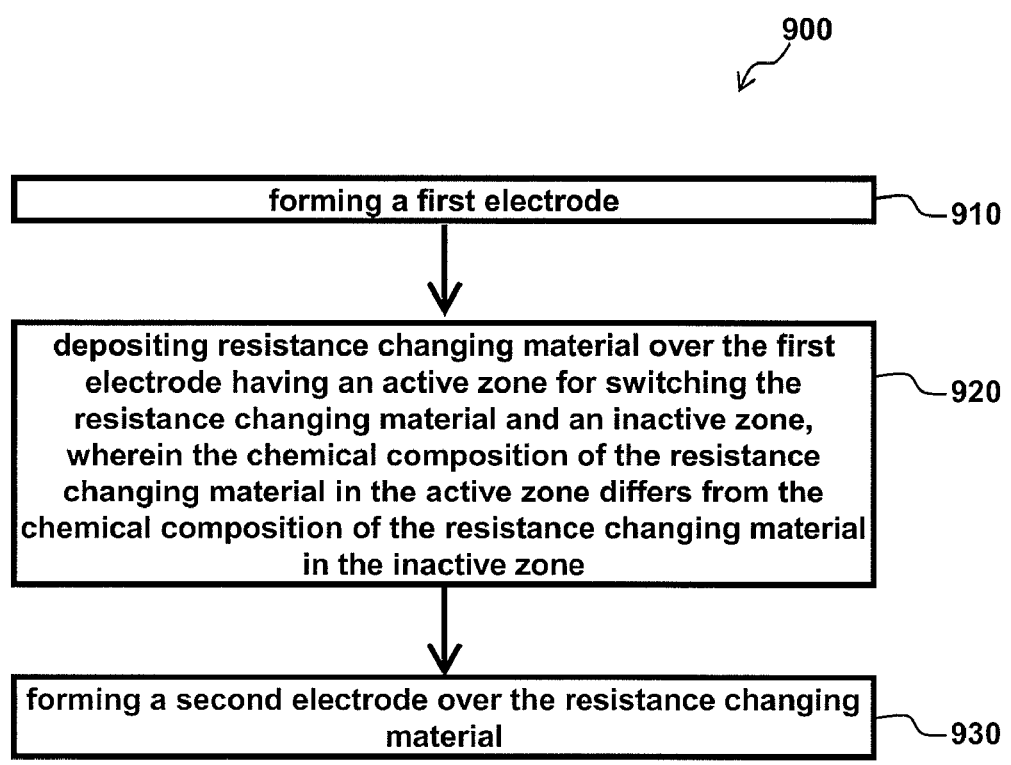
FIG. 9 illustrates a method for fabricating an integrated circuit.

FIG. 9 illustrates one embodiment of a method 900 for fabricating an integrated circuit. At 910, a first electrode is formed. At 920, resistance changing material is deposited over the first electrode having an active zone for switching the resistance changing material and an inactive zone, wherein the chemical composition of the resistance changing material in the active zone differs from the chemical composition of the resistance changing material in the inactive zone. At 930, a second electrode is formed over the resistance changing material.

Embodiments provide a phase change memory cell including a phase change element having different chemical compositions in the active and inactive zone. In one embodiment, the phase change element includes GST. Other embodiments illustrate memory elements having less Antimony (Sb) in the inactive zone.

One embodiment provides an integrated circuit including a first electrode, a second electrode, a memory element coupled to the first electrode and to the second electrode, the memory element comprising resistance changing material having an active zone for switching the memory element and an inactive zone, wherein the chemical composition of the resistance changing material in the active zone always differs from the chemical composition of the resistance changing material in the inactive zone. As used herein, the term "always" means during cycling of the memory element. "Always" refers to a time wise approach of usage of the resistance changing material during cycling. For phase change material, "always" means during cycling of the phase change material between amorphous and crystalline states.

While the specific embodiments described herein substantially focused on fabricating phase change memory cells, the embodiments can be applied to any suitable type of resistive or resistivity changing memory cells.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit, comprising:
a first electrode;
a second electrode; and
a memory element coupled to the first electrode and to the second electrode, the memory element comprising phase changing material having a first region with an active zone for switching the memory element and a second region with an inactive zone, wherein a chemical composition of the phase changing material in the first region differs from a chemical composition of the phase changing material in the second region during all operations of the memory element, and wherein the second region is coupled to the second electrode and the first region is coupled to the first electrode, the first region extending from the first electrode to the second electrode and laterally surrounding the second region such that the second region is embedded into the first region.

2. The integrated circuit of claim 1, wherein the phase changing material in the active zone of the memory element has a different stoichiometric chemical composition than the phase changing material in the inactive zone during all operations of the memory element.

3. The integrated circuit of claim 1, wherein the chemical composition of the phase changing material gradually changes from the active zone towards the inactive zone.

4. The integrated circuit of claim 1, wherein the phase changing material comprises GST.

5. The integrated circuit of claim 4, wherein the GST has less Antimony in the second region than in the first region of the memory element.

6. The integrated circuit of claim 4, wherein the memory element comprises at least one of Germanium or Tellurium in the inactive zone.

7. A system, comprising:
a host; and
a memory device communicatively coupled to the host, the memory device comprising:
a first electrode;
second electrode; and
a memory element coupled to the first electrode and the second electrode, the memory element comprising phase changing material having a first region with an active zone for switching the memory element and a second region with an inactive zone, wherein a chemical composition of the phase changing material in the first region differs from a chemical composition of the phase changing material in the second region during all operations of the memory element, and wherein the second region is coupled to the second electrode and the first region is coupled to the first electrode, the first region extending from the first electrode to the second electrode and laterally surrounding the second region such that the second region is embedded into the first region.

8. The system of claim 7, wherein the phase changing material comprises GST.

9. The system of claim 8, wherein the GST has less Antimony in the second region than in the first region of the memory element.

10. The system of claim 8, wherein the memory element comprises at least one of Germanium or Tellurium in the inactive zone.

* * * * *